(12) United States Patent
Verbruggen et al.

(10) Patent No.: US 11,716,089 B1
(45) Date of Patent: Aug. 1, 2023

(54) DELAY-TRACKING BIASING FOR VOLTAGE-TO-TIME CONVERSION

(71) Applicant: XILINX, INC., San Jose, CA (US)

(72) Inventors: Bob W. Verbruggen, Dublin (IE); Christophe Erdmann, Nice (FR)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/696,734

(22) Filed: Mar. 16, 2022

(51) Int. Cl.
*H03M 1/06* (2006.01)

(52) U.S. Cl.
CPC ....... *H03M 1/0604* (2013.01); *H03M 1/0682* (2013.01)

(58) Field of Classification Search
CPC ..... H03M 1/06; H03M 1/0604; H03M 1/0682
See application file for complete search history.

(56) References Cited

U.S. PATENT DOCUMENTS

| | | | | |
|---|---|---|---|---|
| 5,282,094 A | * | 1/1994 | Ngo | G11B 5/09 |
| 5,321,710 A | * | 6/1994 | Cornish | H04B 10/58 |
| | | | | 372/32 |
| 5,349,253 A | * | 9/1994 | Ngo | H03K 19/01812 |
| | | | | 326/77 |
| 5,420,536 A | * | 5/1995 | Faulkner | H03C 5/00 |
| | | | | 330/285 |
| 5,812,019 A | * | 9/1998 | Ngo | G11B 5/012 |
| 5,831,784 A | * | 11/1998 | Barnett | H03F 3/45479 |
| | | | | 330/252 |
| 5,856,891 A | * | 1/1999 | Ngo | H03F 3/45479 |
| | | | | 330/258 |
| 6,043,712 A | * | 3/2000 | Leizerovich | H03F 1/0261 |
| | | | | 330/297 |
| 6,107,888 A | * | 8/2000 | Price, Jr. | H03F 3/45071 |
| | | | | 330/301 |
| 6,307,699 B1 | * | 10/2001 | Patti | G11B 5/012 |
| 6,618,406 B1 | * | 9/2003 | Kaminishi | H01S 5/042 |
| | | | | 372/38.02 |
| 6,879,817 B1 | * | 4/2005 | Sorrells | H04B 1/30 |
| | | | | 455/313 |
| 6,963,734 B2 | * | 11/2005 | Sorrells | H03D 3/006 |
| | | | | 327/356 |
| 6,993,299 B2 | * | 1/2006 | Sugar | H04W 52/42 |
| | | | | 455/105 |

(Continued)

OTHER PUBLICATIONS

T. E. Rahkonen et al., "The use of stabilized CMOS delay lines for the digitization of short time intervals," in IEEE Journal of Solid-State Circuits, vol. 28, No. 8, pp. 887-894, Aug. 1993.

(Continued)

*Primary Examiner* — Lam T Mai
(74) *Attorney, Agent, or Firm* — Patterson + Sheridan, LLP

(57) ABSTRACT

A biasing scheme for a voltage-to-time converter (VTC). An example biasing circuit generally includes a reference current source; a feedback loop current source; an amplifier having a first input coupled to a target voltage node, having a second input, and having an output coupled to a control input of the reference current source and to a control input of the feedback loop current source; a first capacitive element; a first switch coupled in parallel with the first capacitive element; a second switch coupled between the feedback loop current source and the first capacitive element; and a third switch coupled between the first capacitive element and the second input of the amplifier.

20 Claims, 5 Drawing Sheets

(56) References Cited

U.S. PATENT DOCUMENTS

| | | | | |
|---|---|---|---|---|
| 7,911,261 | B1* | 3/2011 | Shamarao | G05F 3/08 |
| | | | | 327/535 |
| 11,521,682 | B2* | 12/2022 | Tran | G06N 3/048 |
| 2006/0012447 | A1* | 1/2006 | Partovi | H03B 5/1253 |
| | | | | 331/185 |

OTHER PUBLICATIONS

A. Ravi et al., "A 9.2-12GHz, 90nm digital fractional-N synthesizer with stochastic TDC calibration and -35/-41dBc integrated phase noise in the 5/2.5GHz bands," 2010 Symposium on VLSI Circuits, 2010, pp. 143-144.

Y. Lyu et al., "A 4-GS/s 39.9-dB SNDR 11.7-mW Hybrid Voltage-Time Two-Step ADC With Feedforward Ring Oscillator-Based TDCs," in IEEE Journal of Solid-State Circuits, vol. 55, No. 7, pp. 1807-1818, Jul. 2020.

M. Zhang et al., "3.5 A 0.6V 13b 20MS/s Two-Step TDC-Assisted SAR ADC with PVT Tracking and Speed-Enhanced Techniques," 2019 IEEE International Solid-State Circuits Conference—(ISSCC), 2019, pp. 66-68.

M. Zhang et al., "16.2 A 4× Interleaved 10GS/s 8b Time-Domain ADC with 16× Interpolation-Based Inter-Stage Gain Achieving >37.5dB SNDR at 18GHz Input," 2020 IEEE International Solid-State Circuits Conference—(ISSCC), 2020, pp. 252-254.

* cited by examiner

US 11,716,089 B1

DELAY-TRACKING BIASING FOR VOLTAGE-TO-TIME CONVERSION

TECHNICAL FIELD

Examples of the present disclosure generally relate to electronic circuits and, more particularly, to biasing a voltage-to-time converter (VTC).

BACKGROUND

Many electronic devices receive or sense an analog signal and convert the analog signal to a digital signal for further signal processing, control signal generation, and/or interpretation in the digital domain, such as by a processor or microcontroller. An analog-to-digital converter (ADC) may be used to convert such an analog signal to a digital signal. Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption. Yet another type of ADC gaining popularity is a time-based ADC. Contemporary time-based ADCs may be extremely competitive with and, in some cases, may significantly outperform conventional ADC architectures in some applications.

SUMMARY

Examples of the present disclosure generally relate to a biasing scheme for a voltage-to-time converter (VTC).

An example of the present disclosure is directed to a biasing circuit for a VTC. The biasing circuit generally includes a reference current source; a feedback loop current source; an amplifier having a first input coupled to a target voltage node, having a second input, and having an output coupled to a control input of the reference current source and to a control input of the feedback loop current source; a first capacitive element; a first switch coupled in parallel with the first capacitive element; a second switch coupled between the feedback loop current source and the first capacitive element; and a third switch coupled between the first capacitive element and the second input of the amplifier.

Another example of the present disclosure is directed to a time-based analog-to-digital converter (ADC). The time based ADC generally includes a VTC and a biasing circuit as described herein coupled to the VTC. For some examples, the time-based ADC may further include a time-to-digital converter (TDC) having an input coupled to an output of the VTC.

Yet another example of the present disclosure is directed to a programmable integrated circuit (IC). The programmable IC generally includes a VTC and a biasing circuit as described herein coupled to the VTC. For some examples, the programmable IC includes a time-based ADC, which may include the VTC and the biasing circuit for the VTC. For some examples, the time-based ADC in the programmable IC may further include a TDC having an input coupled to an output of the VTC.

Yet another example of the present disclosure is directed to a method of biasing a VTC. The method generally includes generating a pulse having a duration; during the duration of the pulse, charging a capacitive element with a feedback current; at an end of the pulse, holding a voltage across the capacitive element; applying the held voltage across the capacitive element to an amplifier input; amplifying a difference between a voltage at the amplifier input and a target voltage to generate a control voltage; controlling the feedback current and a reference current based on the control voltage; and generating one or more bias currents for the VTC based on the reference current.

Yet another example of the present disclosure is directed to a biasing circuit for a VTC. The biasing circuit generally includes means for generating a pulse having a duration; means for charging a capacitive element with a feedback current during the duration of the pulse; means for holding a voltage across the capacitive element at an end of the pulse; means for amplifying a difference between a voltage at an input of the means for amplifying and a target voltage to generate a control voltage; means for applying the held voltage across the capacitive element to the input of the means for amplifying; means for controlling the feedback current and a reference current based on the control voltage; and means for generating one or more bias currents for the VTC based on the reference current.

These and other aspects may be understood with reference to the following detailed description.

BRIEF DESCRIPTION OF DRAWINGS

So that the manner in which the above-recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1:
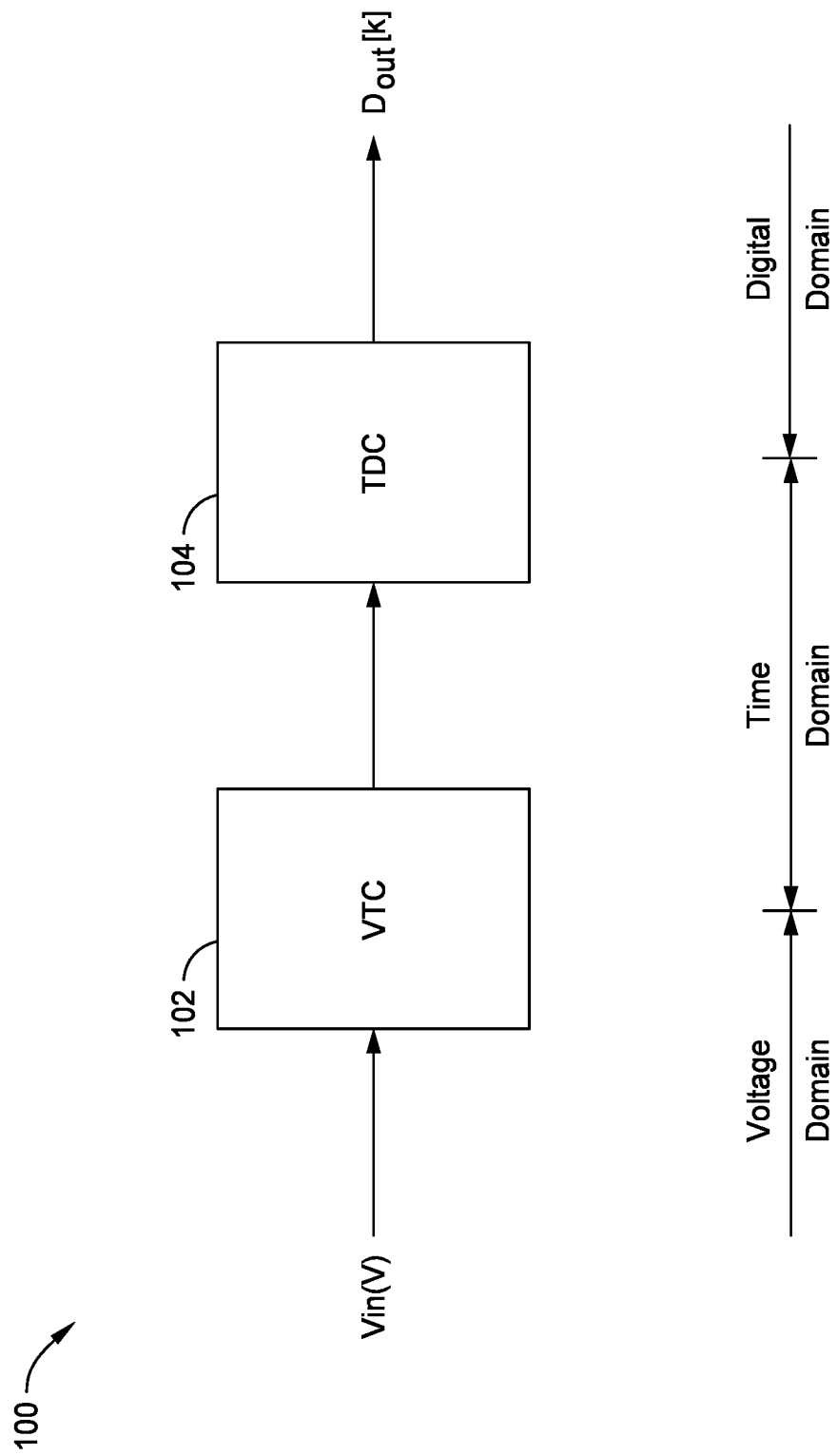
FIG. 1 is a block diagram of an example time-based analog-to-digital converter with a voltage-to-time converter (VTC) and a time-to-digital converter (TDC), in which some examples of the present disclosure may be practiced.

Examples of the present disclosure provide a biasing scheme to address voltage-to-time gain variation in voltage-to-time converters (VTCs) (e.g., constant-slope VTCs). For example, examples of the present disclosure provide techniques and apparatus for biasing a VTC such that the VTC tracks the innate time resolution of a time-to-digital converter (TDC).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Time-Based ADC

Many analog circuit blocks (which represent information in voltage or current) suffer from scaling as various semiconductor processes are capable of producing smaller and smaller transistors. This performance degradation also applies to many types of conventional voltage-based analog-to-digital converters (ADCs). Therefore, other ADC architectures are being explored, which are designed to minimize, or at least reduce, analog circuitry reliance, replace high-accuracy and/or high-linearity circuits with those of adequate performance, and correct for such inaccuracies in the digital domain. ADC architectures designed with this approach may then benefit from scaling. One such type of ADC architecture is a time-based ADC, in which analog information is represented with a time-based quantity, such as a pulse width. Analog processing using time may enjoy the benefits of scaling due to the inherently higher resolution in time in state-of-the-art CMOS process nodes.

FIG. 1 is a block diagram of an example time-based ADC 100, in which some examples of the present disclosure may be practiced. In a time-based ADC, an analog input voltage is first converted to a time by a voltage-to-time converter (VTC) 102, which is then converted to a digital signal by a time-to-digital converter (TDC) 104. In other words, a signal in the voltage domain is converted by the VTC 102 to a signal in the time domain, which is in turn converted by the TDC 104 to a signal in the digital domain. FIG. 1 provides a basic block diagram of a time-based ADC, but there may be additional components added that are not shown here, such as a feedback loop.

As technologies have scaled, inverter delays have decreased, which has typically also improved the time resolution of the TDC. This can, in turn, be leveraged to improve the resolution and/or speed of time-based ADCs. In addition to the improved time resolution, the highly digital nature of TDCs (which are composed primarily of digital cells) has offered significant efficiency enhancements in deeply scaled complementary metal-oxide-semiconductor (CMOS) technology, such as in a 7 nm fin field-effect transistor (FinFET) process.

The voltage-to-time gain of the VTC may be overlooked in designing time-based ADCs. The impact of the VTC gain may depend on the ADC architecture. For example, in some architectures, the VTC gain simply modulates the full-scale range of the ADC, so the input power to the ADC may be adjusted when conditions change. For other architectures, the TDC output is converted back to voltage by a capacitive digital-to-analog converter (DAC) to generate a residue. Because of this, the VTC gain may most likely be finely tuned to achieve correct operation, such as by trimming a bias voltage (e.g., in a lab setting). These solutions are problematic for a product environment in which circuits should function predictably, for any reasonable combination of process, voltage, and temperature. VTC gain control may be addressed by some architectures, in which the gain of the VTC is tied to the time resolution of the TDC by using current-starved inverters as the TDC unit delay cell. However, the current starving may degrade the time resolution of the TDC, as well as add noise and/or area to the implementation.

Accordingly, examples of the present disclosure provide a biasing scheme to address voltage-to-time gain variation in VTCs. For example, examples of the present disclosure provide techniques and apparatus for biasing a VTC such that the VTC tracks the innate time resolution of a TDC, without penalizing resolution or calling for a specific delay element structure.

Example VTC

Figure 2A:
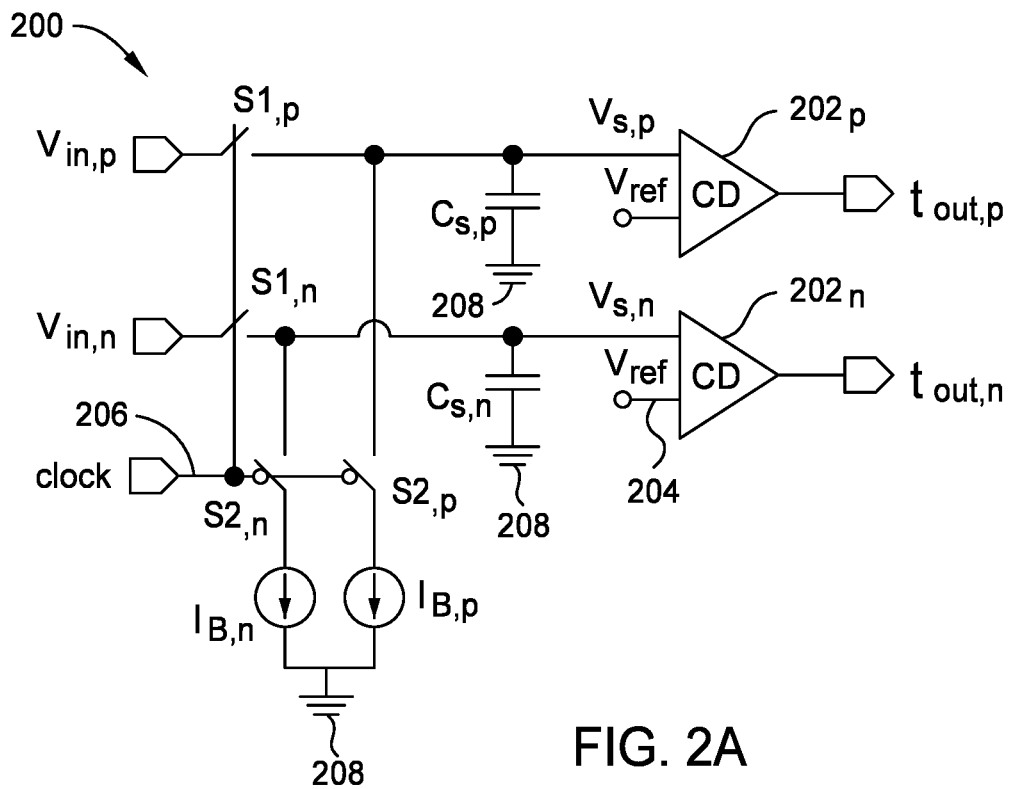
FIG. 2A is a circuit diagram of an example VTC, in which some examples of the present disclosure may be practiced.

As described above, voltage-to-time converters (VTCs) are used (e.g., in time-based ADCs) to convert an analog input voltage to an output time. FIG. 2A is a circuit diagram of an example constant-slope VTC 200, where a biasing circuit (in accordance with examples of the present disclosure) may control the bias current for the VTC. The VTC 200 includes differential voltage inputs $V_{in,p}$ and $V_{in,n}$, switches $S1,p$, $S1,n$, $S2,p$, and $S2,n$, sampling capacitors $C_{S,p}$ and $C_{S,n}$, crossing detectors 202$p$ and 202$n$, differential time outputs $t_{out,p}$ and $t_{out,n}$, and current sinks $I_{B,p}$ and $I_{B,n}$.

As illustrated in FIG. 2A, a first input $V_{S,p}$ or $V_{S,n}$ of each of the crossing detectors 202$p$ and 202$n$ is coupled to a first terminal of the corresponding sampling capacitor $C_{S,p}$ or $C_{S,n}$, to a first terminal of the corresponding switch $S1,p$ or $S1,n$, and to a first terminal of the corresponding switch $S2,p$ or $S2,n$. A second input of each of the crossing detectors 202$p$ and 202$n$ is coupled to a reference voltage node 204 configured to have a reference voltage $V_{ref}$. An output of each of the crossing detectors 202$p$ and 202$n$ is coupled to a corresponding differential output $t_{out,p}$ or $t_{out,n}$ of the VTC 200. A second terminal of each of the sampling capacitors $C_{S,p}$ and $C_{S,n}$ is coupled to a reference potential node 208 for the VTC 200. A second terminal of each of the switches $S1,p$ and $S1,n$ is coupled to a corresponding differential input $V_{in,p}$ or $V_{in,n}$. Each of the current sinks $I_{B,p}$ and $I_{B,n}$ is coupled between a second terminal of the corresponding switch $S2,p$ or $S2,n$ and the reference potential node 208. A clock node 206 configured to have a clock signal is coupled to control inputs of the switches $S1,p$ and $S1,n$ and to inverse control inputs of the switches $S2,p$ and $S2,n$.

Figure 2B:
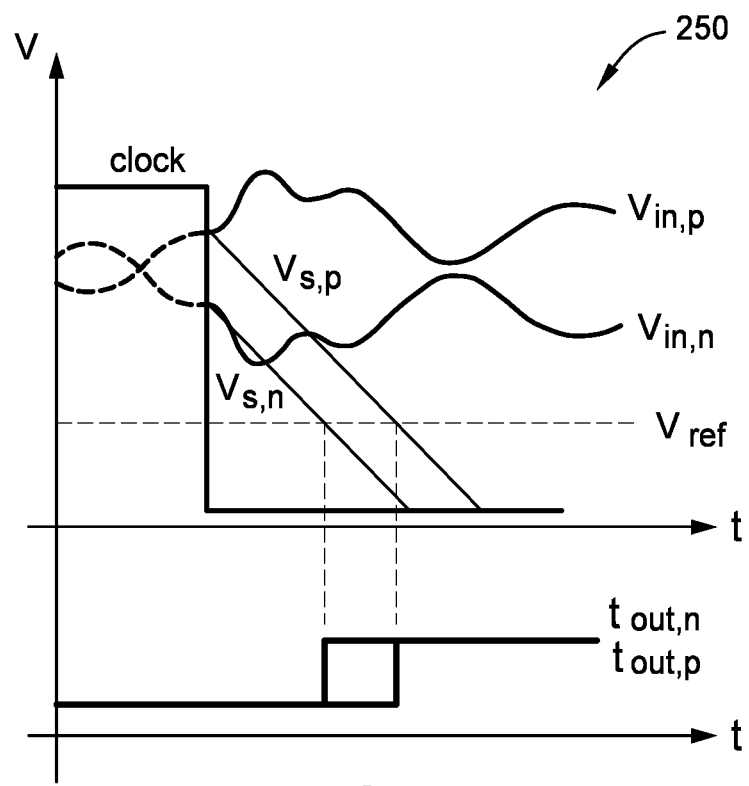
FIG. 2B is a graph of example waveforms for the VTC of FIG. 2A.

Operation of the VTC 200 is illustrated in the graph 250 of FIG. 2B. During a high phase of the clock (e.g., when the clock signal on the clock node 206 is logic high), the switches $S1,p$ and $S1,n$ are closed, the switches $S2,p$ and $S2,n$ are open, and the differential input voltages $V_{in,p}$ and $V_{in,n}$ are sampled on the capacitors $C_{S,p}$ and $C_{S,n}$. When the falling edge of the clock signal arrives, the switches $S1,p$ and $S1,n$ are opened, the switches $S2,p$ and $S2,n$ are closed, and the sampled voltages $V_{S,p}$ and $V_{S,n}$ are discharged at a constant rate by the current sinks $I_{B,p}$ and $I_{B,n}$. When the discharging voltages $V_{S,p}$ and $V_{S,n}$ cross the reference voltage $V_{ref}$ (e.g., fall below $V_{ref}$), the differential time outputs $t_{out,p}$ and $t_{out,n}$ are pulled up. It can be seen that the output time difference between $t_{out,p}$ and $t_{out,n}$ is linearly related to the differential sampled input voltage $V_{in,p}-V_{in,n}$ and that the voltage-to-time gain ($\text{gain}_{VTC}$) is given by $$\text{gain}_{VTC} = \frac{C_S}{I_B}$$

where $C_S$ is the capacitance of the sampled capacitors $C_{S,p}$ and $C_{S,n}$ and $I_B$ is the bias current of the current sinks $I_{B,p}$ and $I_{B,n}$.

For a time-to-digital converter (TDC) with a time resolution (e.g., the time of the least significant bit (LSB)) of $t_{LSB}$, the goal would be to achieve a constant input-referred voltage LSB given by $$V_{LSB} = \frac{t_{LSB} \cdot I_B}{C_S}$$

Example Biasing Circuit for a VTC

Examples of the present disclosure control the bias currents $I_B$ for the VTC in a manner that tracks the innate time resolution of a TDC, without penalizing resolution or demanding a specific delay element structure.

Figure 3:
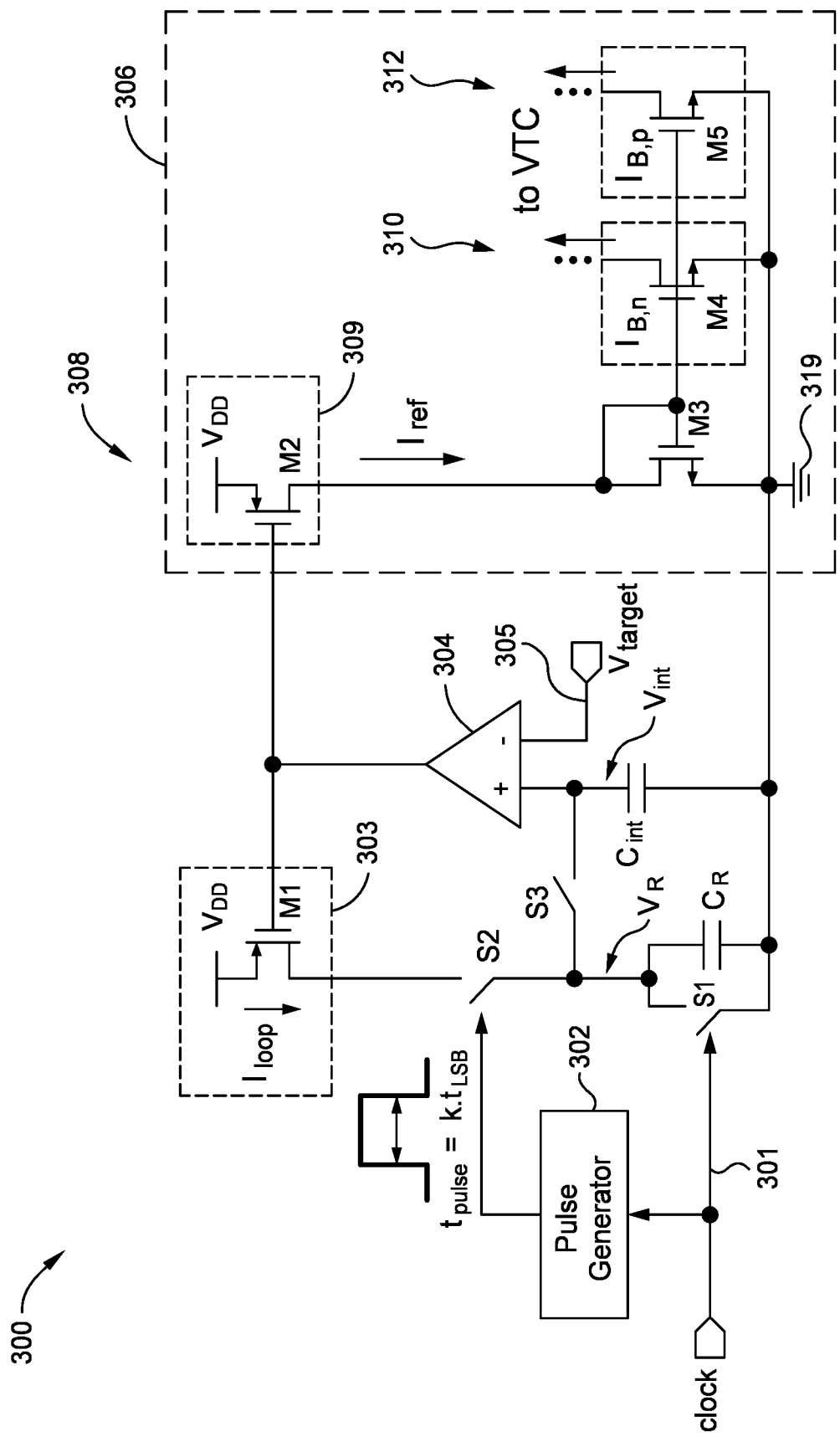
FIG. 3 is a circuit diagram of an example biasing circuit for a VTC, according to some examples of the present disclosure.

FIG. 3 is a circuit diagram of an example biasing circuit 300 for a VTC (e.g., the VTC 200 of FIG. 2), according to some examples of the present disclosure. The biasing circuit includes switches S1, S2, and S3, an amplifier 304, a reset capacitive element $C_R$ (a first capacitive element), a feedback loop current source 303, and a reference current source 309. For some examples, the biasing circuit 300 may also include a pulse generator 302. For some examples, the biasing circuit 300 may also include an integration capacitive element $C_{int}$ (a second capacitive element), as shown in FIG. 3, to stabilize the feedback loop (described below). For other examples, the integration capacitive element $C_{int}$ may be omitted, and the feedback loop may be stabilized in another way.

The biasing circuit 300 may include a mixed signal feedback loop, which may be formed by the amplifier, the feedback loop current source 303, and switches S2 and S3 (and in some cases, the capacitive element $C_{int}$). The feedback loop current source 303 may be implemented, for example, by a transistor M1.

For some examples, the reference current source 309 may be part of a current mirror 306, as illustrated in FIG. 3. The current mirror 306 has a first branch 308, a second branch 310, and a third branch 312. The first branch 308 includes the reference current source 309 (which may be implemented by transistor M2 as shown) and a transistor M3. A control input of the reference current source 309 (e.g., a gate of transistor M2) may be coupled to an output of the amplifier 304. Transistor M2 may have a source coupled to a power supply rail (labeled "$V_{DD}$") for the biasing circuit 300 and have a drain coupled to a drain and a gate of transistor M3. The second branch 310 of the current mirror 306 may have a first bias current sink (e.g., $I_{B,n}$) of the VTC, which may be implemented by transistor M4. Similarly, the third branch 312 of the current mirror 306 may have a second bias current sink (e.g., $I_{B,p}$) of the VTC, which may be implemented by transistor M5. Sources of transistors M4 and M5 may be coupled to the reference potential node 319, drains of transistors M4 and M5 may be coupled to the VTC (e.g., to switches S2,n and S2,p), and gates of transistors M4 and M5 may be coupled to the gate and drain of transistor M3 in the first branch 308 of the current mirror.

The reader is to understand, however, that the current mirror 306 is optional and that there are other suitable ways of generating bias currents for the VTC based on tunable current sources. For example, two instances of transistor M2 could be used to source bias currents to a complementary version of the VTC 200 directly, or a complementary version of the biasing circuit could be implemented to generate current sinks directing using the control voltage.

The amplifier 304 has a first input (e.g., a negative input) coupled to a target voltage node 305 having a target voltage $V_{target}$. For some examples, the capacitive element C is coupled between a second input (e.g., a positive input) of the amplifier 304 and a reference potential node 319 for the biasing circuit 300. In addition to the control input of the reference current source 309, the output of the amplifier 304 may also be coupled to a control input of the feedback loop current source 303 (e.g., a gate of transistor M1).

Switch S1 may be coupled in parallel with the capacitive element $C_R$, and switch S2 may be coupled between the feedback loop current source 303 and the capacitive element $C_R$. Switch S3 may be coupled between the capacitive element $C_R$ and the second input of the amplifier. For some examples, the capacitive element $C_R$ may have a capacitance that is a predefined multiple (e.g., an integer multiple m) of a capacitance of the sampling capacitors $C_{S,p}$ and $C_{S,n}$.

As illustrated in FIG. 3, an output of the pulse generator 302 may be coupled to a control input of switch S2. A clock node 301 configured to carry a clock signal may be coupled to an input of the pulse generator 302 and to a control input of switch S1. The output of the pulse generator 302 may also be coupled to a control input of switch S3. The pulse generator 302 may be implemented by any of various suitable circuits, such as multiple buffers, inverters, and or other delay elements cascaded in series. For example, if the pulse generator 302 is configured to output a pulse having a duration ($t_{pulse}$) that is an integer multiple k of a time-to-digital converter (TDC) time resolution ($t_{LSB}$), the pulse generator 302 may be implemented by k cascaded buffers. The feedback loop of the biasing circuit 300 does not depend on the nature of the delay element(s) that set the TDC resolution ($t_{LSB}$).

During operation of the biasing circuit 300, when a dock signal on the clock node 301 is logical high, switch S1 doses to discharge the capacitive element $C_R$, thereby resetting the voltage $V_R$ across the capacitive element $C_R$ to zero. At a falling edge of the clock signal, switch S1 is opened, and the pulse generator 302 generates and outputs a clock pulse with a duration $t_{pulse}$. The duration $t_{pulse}$ may be designed to be a predefined multiple (e.g., an integer multiple k) of the TDC delay time $t_{LSB}$, as described above. During the duration of the pulse, switch S2 is closed and allows a loop current $I_{loop}$ from the feedback loop current source 303 to charge the capacitive element $C_R$, thereby linearly increasing voltage $V_R$. At the end of the duration $t_{pulse}$, switch S2 opens, and voltage $V_R$ is held by the capacitive element $C_R$. This held value of voltage $V_R$ is called voltage $V_{R,sampled}$ and can be shown to be $$V_{R,sampled} = \frac{I_{loop} \cdot t_{pulse}}{C_R}$$

The output of the pulse generator 302 may also be used to control switch S3, such that switch S3 is closed on the falling edge of the pulse (e.g., the end of the duration $t_{pulse}$) and thus shares the voltage $V_{R,sampled}$ with the second input of the amplifier (e.g., with the capacitive element $C_{int}$) to increase or decrease the voltage $V_{int}$ at the second input. For some examples, the capacitance of the capacitive element $C_{int}$ is much larger than the capacitance of the capacitive element $C_R$.

The difference between $V_{int}$ and a target voltage $V_{target}$ is amplified by the amplifier 304, and the output of the amplifier controls the feedback loop current source 303 (and the reference current source 309) to adjust the loop current $I_{loop}$ (and the reference current $I_{ref}$, which may be equal to $I_{loop}$ depending on the transistor size ratio of transistor M1 to transistor M2). More specifically, the amplifier 304 may adjust the loop current $I_{loop}$ (and the reference current $I_{ref}$) such that if $V_{R,sampled}$ is below $V_{target}$, then hoop is increased, whereas if $V_{R,sampled}$ is above $V_{target}$, then $I_{loop}$ is decreased. As a result, when the feedback loop is settled, $V_{R,sampled}$ will be equal to $V_{target}$, and loop will be given by $$I_{loop} = \frac{V_{target} \cdot C_R}{t_{pulse}}$$

The reference current $I_{ref}$ is equal to or proportional to the loop current $I_{loop}$ (because the output of the amplifier 304 is used to control both the feedback loop current source 303 and the reference current source 309 with the same voltage, and these current sources may be implemented with similar transistors). Furthermore, the bias currents (e.g., $I_{B,p}$ and $I_{B,n}$) for the VTC are equal to or proportional to the reference current $I_{ref}$. Thus, the loop current $I_{loop}$ (or a current proportional thereto based on transistor size ratios in the current mirror 306) may be used to bias the VTC (with bias currents $I_{B,p}$ and $I_{B,n}$). This means the input-referred voltage LSB works out to be $$V_{LSB} = \frac{t_{LSB} \cdot V_{target} \cdot C_R}{t_{pulse} \cdot C_S} = \frac{m \cdot V_{target}}{k}$$

In other words, the input-referred voltage LSB can be arbitrarily chosen by choosing $V_{target}$, and the VTC gain will automatically and correctly track the TDC resolution.

There may be aspects which affect the accuracy of the feedback loop in the biasing circuit 300. For example, a parasitic capacitance at the output of the feedback loop current source 303, amplifier mismatch, and mismatches in $t_{pulse}$ and $C_R$ may contribute errors that affect the biasing current output(s). However, these contributions can be mitigated by correctly designing the loop and/or with a calibration trim to correct for these errors, after which the biasing loop may be subject only to voltage and temperature variations between the VTC biasing loop and the TDC.

Example Biasing Operations

Figure 4:
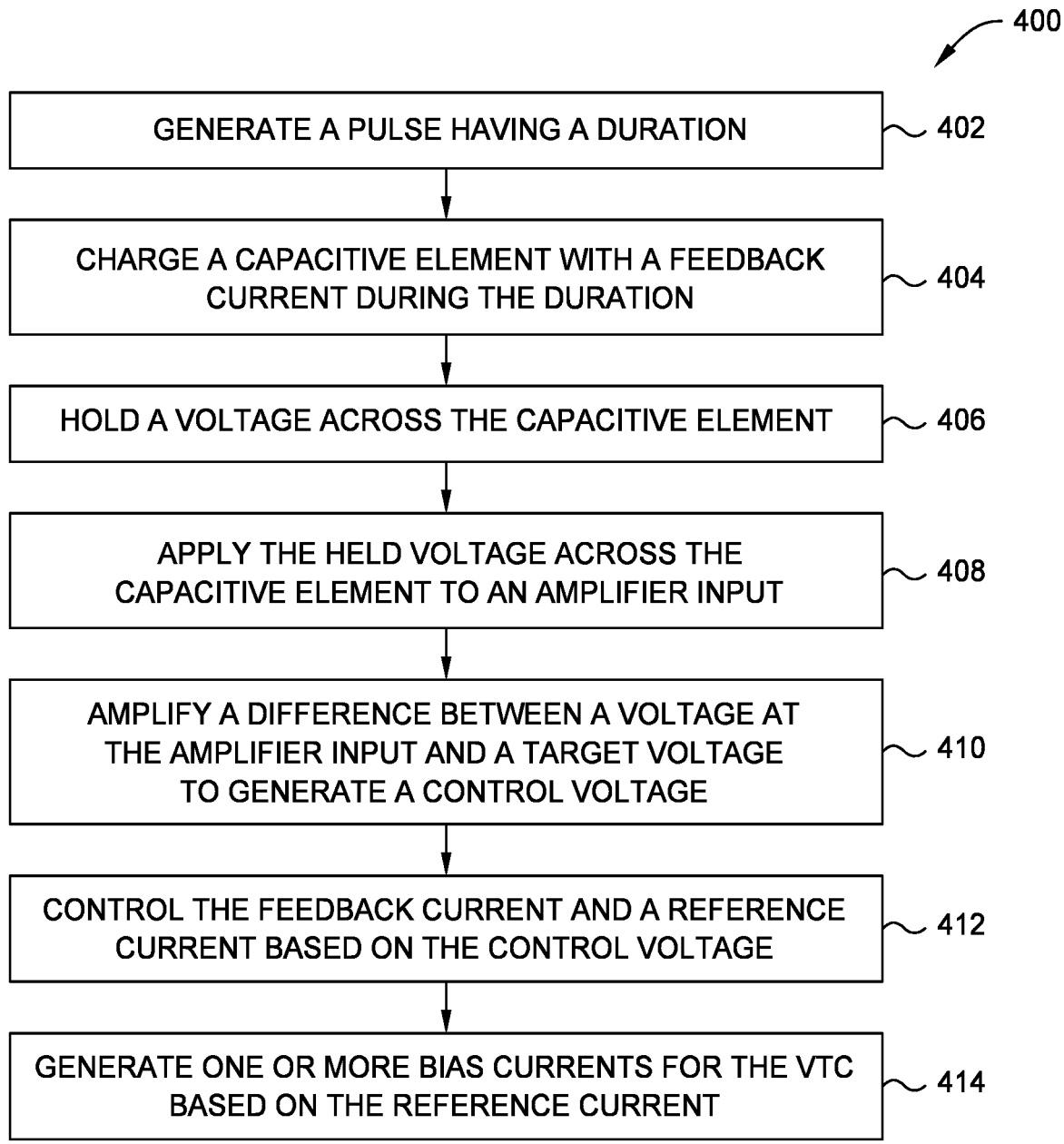
FIG. 4 is a flow diagram of example operations for biasing a VTC, according to some examples of the present disclosure.

FIG. 4 is a flow diagram of example operations 400 for biasing a voltage-to-time converter (VTC), according to some examples of the present disclosure. The operations 400 may be performed by a biasing circuit (e.g., the biasing circuit 300 of FIG. 3). The flow diagram includes blocks representing the operations 400.

The operations 400 may begin, at block 402, with the biasing circuit generating a pulse having a duration (e.g., $t_{pulse}$). During the duration of the pulse, the biasing circuit may charge a capacitive element (e.g., capacitive element $C_R$) with a feedback current (e.g., Iop) at block 404. At an end of the pulse, the biasing circuit may hold a voltage (e.g., $V_R$) across the capacitive element at block 406. At block 408, the biasing circuit may apply the held voltage across the capacitive element to an amplifier input (e.g., an input of an error amplifier, such as the positive input of amplifier 304). At block 410, the biasing circuit may amplify a difference between a voltage at the amplifier input (e.g., $V_{int}$) and a target voltage (e.g., $V_{target}$) to generate a control voltage (e.g., the output voltage of amplifier 304). At block 412, the biasing circuit may control the feedback current and a reference current (e.g., $I_{ref}$) based on the control voltage and, at block 414, generate one or more bias currents (e.g., $I_{B,p}$ and $I_{B,n}$) for the VTC based on the reference current.

According to some examples, the operations 400 may further include resetting the voltage across the capacitive element by closing a switch (e.g., switch S1) coupled in parallel with the capacitive element.

According to some examples, charging the capacitive element at block 404 may involve closing a switch (e.g., switch S2) coupled between the capacitive element and a current source (e.g., the feedback loop current source 303) providing the feedback current. In this case, holding the voltage across the capacitive element at block 406 may include opening the switch to hold the voltage.

According to some examples, applying the held voltage across the capacitive element to the amplifier input at block 408 may include dosing a switch (e.g., switch S3) coupled between the capacitive element and the amplifier input.

According to some examples, controlling the feedback current and the reference current at block 412 may involve: (a) increasing the feedback current and the reference current when the voltage at the amplifier input is below the target voltage and/or (b) decreasing the feedback current and the reference current when the voltage at the amplifier input is above the target voltage.

According to some examples, controlling the feedback current and the reference current at block 412 may include controlling the feedback current to settle at a value equal to the target voltage multiplied by a capacitance of the capacitive element and divided by the duration of the pulse. In this case, controlling the feedback current and the reference current may also involve controlling the reference current to equal or be proportional to the feedback current. For some examples, generating the one or more bias currents for the VTC at block 414 may include generating a bias current to equal or be proportional to the reference current.

According to some examples, the duration of the pulse may be a predefined multiple of a time-to-digital converter (TDC) time resolution (e.g., $t_{LSB}$). For example, the duration of the pulse may be an integer multiple k of a TDC time resolution.

Example Programmable Integrated Circuits

The voltage-to-time converter (VTC) and associated biasing circuit described herein may be implemented in a time-based analog-to-digital converter (ADC), for example. A time-based ADC may be included in any of various suitable devices or systems, such as an integrated circuit (IC) or module.

One type of IC that may utilize one or more time-based ADCs and/or VTCs is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 5:
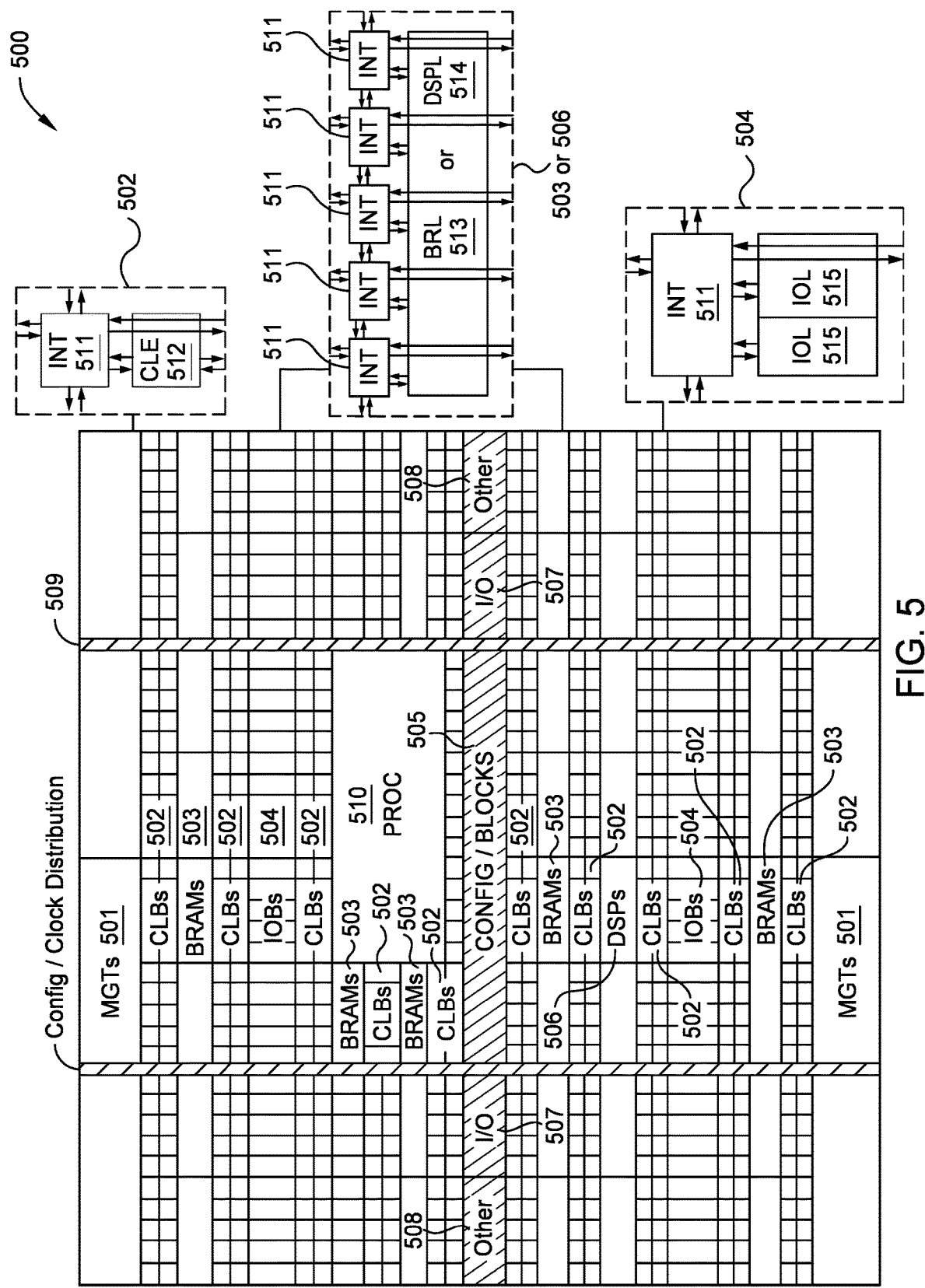
FIG. 5 is a block diagram illustrating an example architecture for a programmable device, in which some examples of the present disclosure may be practiced.

FIG. 5 is a block diagram illustrating an architecture for an example programmable device 500. The architecture may be implemented within a field programmable gate array (FPGA), for example. As shown, the programmable device 500 includes several different types of programmable circuitry (e.g., logic blocks). For example, the programmable device 500 may include a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing (DSP) blocks 506, specialized I/O blocks 507 (e.g., configuration ports and clock ports), and other programmable logic 508, such as digital clock managers, analog-to-digital converters (ADCs), system monitoring logic, and the like. For some examples, one or more ADCs of the programmable device 500 may include a time-based ADC, which may include the voltage-to-time converter (VTC) and the biasing circuit for the VTC described herein.

In some FPGAs, each programmable tile includes a programmable interconnect element (INT) 511 having standardized connections to and from a corresponding INT 511 in each adjacent tile. Therefore, the INTs 511, taken together, implement the programmable interconnect structure for the illustrated FPGA. Each INT 511 also includes the connections to and from the programmable logic element within the same tile, as shown by the examples included at the far right of FIG. 5.

For example, a CLB 502 may include a configurable logic element (CLE) 512 that can be programmed to implement user logic plus a single INT 511. A BRAM 503 may include a BRAM logic element (BRL) 513 in addition to one or more INTs 511. Typically, the number of INTs 511 included in a tile depends on the width of the tile. In the pictured example, a BRAM tile has the same width as five CLBs, but other numbers (e.g., four) can also be used. A DSP block 506 may include a DSP logic element (DSPL) 514 in addition to an appropriate number of INTs 511. An IOB 504 may include, for example, two instances of an I/O logic element (IOL) 515 in addition to one instance of an INT 511. As will be clear to a person having ordinary skill in the art, the actual I/O pads connected, for example, to the IOL 515 typically are not confined to the area of the IOL 515.

In the example programmable device 500 depicted in FIG. 5, a horizontal area near the center of the die (shown shaded in FIG. 5) is used for configuration, clock, and other control logic (CONFIG/CLOCKS 505). Other vertical areas 509 extending from this central area may be used to distribute the clocks and configuration signals across the breadth of the device.

Some FPGAs utilizing the architecture illustrated in FIG. 5 include additional logic blocks that disrupt the regular row structure making up a large part of the FPGA. The additional logic blocks may be programmable blocks and/or dedicated circuitry. For example, a processor block depicted as PROC 510 spans several rows of CLBs 502 and BRAMs 503.

The PROC 510 may be implemented as a hard-wired processor that is fabricated as part of the die that implements the programmable circuitry of the FPGA. The PROC 510 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 510 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 5 that are external to the PROC 510 may be considered part of the, or the, programmable circuitry of the FPGA.

FIG. 5 is intended to illustrate an example architecture that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 5 are exemplary. In an actual FPGA, for example, more than one adjacent row of CLBs 502 is typically included wherever the CLBs appear, in an effort to facilitate the efficient implementation of a user circuit design. The number of adjacent CLB rows, however, can vary with the overall size of the FPGA. Further, the size and/or positioning of the PROC 510 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

For example, means for generating a pulse may include a pulse generator, such as the pulse generator 302 depicted in FIG. 3. Means for charging a capacitive element may include a current source, such as the feedback loop current source 303 portrayed in FIG. 3. Means for holding a voltage may include a capacitor, such as the capacitive element $C_R$ shown in FIG. 3. Means for applying the held voltage may include a switch, such as the switch S3 illustrated in FIG. 3. Means for amplifying may include an amplifier, such as the amplifier 304 depicted in FIG. 3. Means for controlling the feedback current and the reference current may include transistors, such as transistors M1 and M2 shown in FIG. 3. Means for generating one or more bias currents may include one or more transistors, such as transistors M4 and M5 illustrated in FIG. 3.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A biasing circuit for a voltage-to-time converter (VTC), comprising:
    a reference current source;
    a feedback loop current source;
    an amplifier having a first input coupled to a target voltage node, a second input, and an output coupled to a control input of the reference current source and to a control input of the feedback loop current source;
    a first capacitive element;
    a first switch coupled in parallel with the first capacitive element;
    a second switch coupled between the feedback loop current source and the first capacitive element; and
    a third switch coupled between the first capacitive element and the second input of the amplifier.

2. The biasing circuit of claim 1, further comprising a pulse generator having an output coupled to a control input of the second switch.

3. The biasing circuit of claim 2, wherein a clock signal node is coupled to an input of the pulse generator and to a control input of the first switch.

4. The biasing circuit of claim 2, wherein the output of the pulse generator is further coupled to a control input of the third switch.

5. The biasing circuit of claim 2, wherein the pulse generator is configured to output a pulse having a duration that is a predefined multiple of a time-to-digital converter time resolution.

6. The biasing circuit of claim 1, wherein a capacitance of the first capacitive element is a predefined multiple of a capacitance of a second capacitive element of the VTC.

7. The biasing circuit of claim 1, wherein the biasing circuit is configured to:
    increase a feedback current of the feedback loop current source when a voltage sampled by the third switch is below a target voltage of the target voltage node; and
    decrease the feedback current of the feedback loop current source when the voltage sampled by the third switch is above the target voltage of the target voltage node.

8. The biasing circuit of claim 1, further comprising a pulse generator having an output coupled to a control input of the second switch and configured to output a pulse, wherein the biasing circuit is configured to control a feedback current of the feedback loop current source to settle at a value proportional to a target voltage of the target voltage node multiplied by a capacitance of the first capacitive element and divided by a duration of the pulse.

9. The biasing circuit of claim 8, wherein the biasing circuit is configured to control a reference current of the reference current source to be proportional to the feedback current of the feedback loop current source.

10. The biasing circuit of claim 9, further comprising a current mirror having a first branch with the reference current source, having a second branch with a first bias current sink of the VTC, and having a third branch with a second bias current sink of the VTC, wherein a first bias current of the first bias current sink is equal to the reference current, and wherein a second bias current of the second bias current sink is equal to the reference current.

11. A time-based analog-to-digital converter (ADC) comprising the voltage-to-time converter (VTC) and the biasing circuit of claim 1 coupled to the VTC, the time-based ADC further comprising a time-to-digital converter (TDC) having an input coupled to an output of the VTC.

12. A programmable integrated circuit (IC) comprising the voltage-to-time converter (VTC) and the biasing circuit of claim 1 coupled to the VTC.

13. A method of biasing a voltage-to-time converter (VTC), comprising:
    generating a pulse having a duration;
    during the duration of the pulse, charging a capacitive element with a feedback current;
    at an end of the pulse, holding a voltage across the capacitive element;
    applying the held voltage across the capacitive element to an amplifier input;
    amplifying a difference between a voltage at the amplifier input and a target voltage to generate a control voltage;
    controlling the feedback current and a reference current based on the control voltage; and
    generating one or more bias currents for the VTC based on the reference current.

14. The method of claim 13, further comprising resetting the voltage across the capacitive element by closing a switch coupled in parallel with the capacitive element.

15. The method of claim 13, wherein charging the capacitive element comprises closing a switch coupled between the capacitive element and a current source providing the feedback current and wherein holding the voltage across the capacitive element comprises opening the switch.

16. The method of claim 13, wherein applying the held voltage across the capacitive element to the amplifier input comprises closing a switch coupled between the capacitive element and the amplifier input.

17. The method of claim 13, wherein controlling the feedback current and the reference current comprises:
   increasing the feedback current and the reference current when the voltage at the amplifier input is below the target voltage; and
   decreasing the feedback current and the reference current when the voltage at the amplifier input is above the target voltage.

18. The method of claim 13, wherein controlling the feedback current and the reference current comprises controlling the feedback current to settle at a value equal to the target voltage multiplied by a capacitance of the capacitive element and divided by the duration of the pulse.

19. The method of claim 18, wherein controlling the feedback current and the reference current comprises controlling the reference current to be proportional to the feedback current and wherein generating the one or more bias currents for the VTC comprises generating a bias current to equal the reference current.

20. The method of claim 13, wherein the duration of the pulse is a predefined multiple of a time-to-digital converter time resolution.

\* \* \* \* \*